US010903018B2

(12) United States Patent
Penelas Perez et al.

(10) Patent No.: US 10,903,018 B2
(45) Date of Patent: Jan. 26, 2021

(54) SUBSTRATE-ELECTRODE (SE) INTERFACE ILLUMINATED PHOTOELECTRODES AND PHOTOELECTROCHEMICAL CELLS

(71) Applicant: REPSOL, S.A., Madrid (ES)

(72) Inventors: German Penelas Perez, Mostoles (ES); Maria Dolores Hernandez Alonso, Mostoles (ES); Teresa Andreu Arbella, Sant Adria de Besos (ES); Juan Ramon Morante Lleonart, Sant Adria de Besos (ES); Carles Ros Figueras, Sant Adria de Besos (ES); Nina Magali Carretero Gonzalez, Sant Adria de Besos (ES); Eric Calle Martin, Barcelona (ES); Pablo Ortega Villasclaras, Barcelona (ES); Ramon Alcubilla Gonzalez, Barcelona (ES)

(73) Assignees: REPSOL, S.A., Madrid (ES); ENAGAS SERVICES SOLUTIONS, S.L.U., Madrid (ES)

( * ) Notice: Subject to any disclaimer, the term of this patent is extended or adjusted under 35 U.S.C. 154(b) by 128 days.

(21) Appl. No.: 16/065,711

(22) PCT Filed: Dec. 22, 2016

(86) PCT No.: PCT/EP2016/082442
§ 371 (c)(1),
(2) Date: Jun. 22, 2018

(87) PCT Pub. No.: WO2017/109108
PCT Pub. Date: Jun. 29, 2017

(65) Prior Publication Data
US 2019/0013156 A1 Jan. 10, 2019

(30) Foreign Application Priority Data

Dec. 23, 2015 (EP) ..................... 15382658

(51) Int. Cl.
H01G 9/20 (2006.01)
C25B 9/20 (2006.01)
(Continued)

(52) U.S. Cl.
CPC ........... H01G 9/2022 (2013.01); C25B 1/003 (2013.01); C25B 9/20 (2013.01); H01G 9/2031 (2013.01);
(Continued)

(58) Field of Classification Search
CPC .... H01G 9/2022; H01G 9/2031; C25B 1/003; C25B 9/20; H01L 31/0201
See application file for complete search history.

(56) References Cited

FOREIGN PATENT DOCUMENTS

EP 2573209 A1 3/2013
JP 5427653 B2 * 2/2014
WO WO 2013/140325 9/2013

OTHER PUBLICATIONS

Kaga et al., JP-5427653-B2, English Machine Translation (Year: 2014).*

(Continued)

Primary Examiner — Tae-Sik Kang
(74) Attorney, Agent, or Firm — Squire Patton Boggs (US) LLP

(57) ABSTRACT

A photoelectrode for a photoelectrochemical cell is disclosed. The photoelectrode comprises a back-contact solar cell comprising emitter and collector contacts being spaced apart by first openings. The emitter and collector contacts are respectively collected in an emitter busbar and a collector busbar. The photoelectrode further comprises a contact passivation layer to separate the emitter and collector contacts from the electrolyte when in use. The contact passivation layer further comprises second openings in correspondence with the first openings. The photoelectrode further (Continued)

comprises a resin layer covering the openings and a portion of the contact passivation layer such that in use only charge carriers from the emitter contacts traverse the contact passivation layer in its way to the electrolyte while charge carriers from the collector contacts are collected in the collector busbar. An electrocatalyst layer is further provided covering respectively the resin layer and/or the contact passivation layer.

22 Claims, 8 Drawing Sheets

(51) Int. Cl.
*C25B 1/00* (2006.01)
*H01L 31/068* (2012.01)
*H01L 31/02* (2006.01)
*H01L 31/0224* (2006.01)
*H01L 31/18* (2006.01)

(52) U.S. Cl.
CPC .. *H01L 31/0201* (2013.01); *H01L 31/022441* (2013.01); *H01L 31/0682* (2013.01); *H01L 31/1868* (2013.01); *Y02E 10/547* (2013.01); *Y02P 20/133* (2015.11)

(56) References Cited

OTHER PUBLICATIONS

Kaga et al., JP5427653B2, English Machine Translation, Japan, pp. 1-48. (Year: 2014).*

International Search Report for PCT/EP2016/082442, dated Mar. 6, 2017.

Bae, Dowon, et al. "Back-illuminated Si photocathode: a combined experimental and theoretical study for photocatalytic hydrogen evolution." *Energy & Environmental Science* 8.2 (Dec. 12, 2014).

* cited by examiner

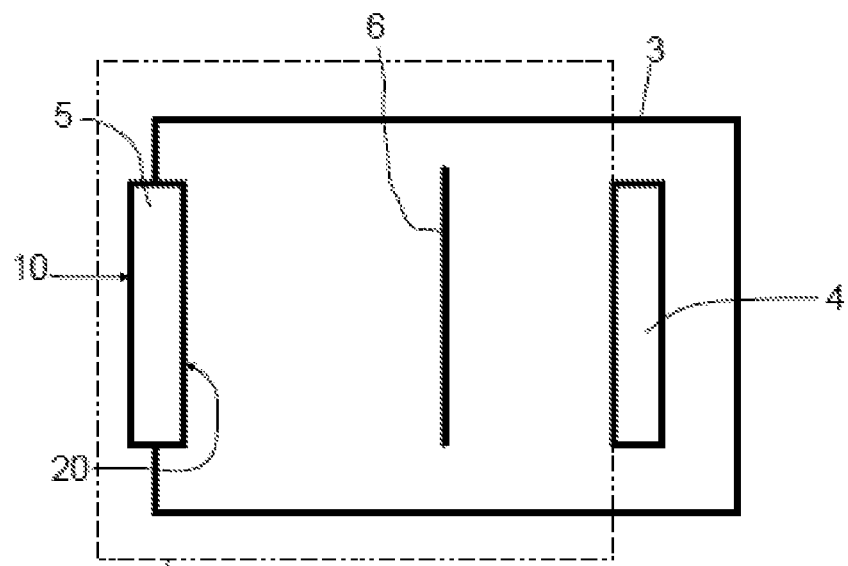
FIG. 3
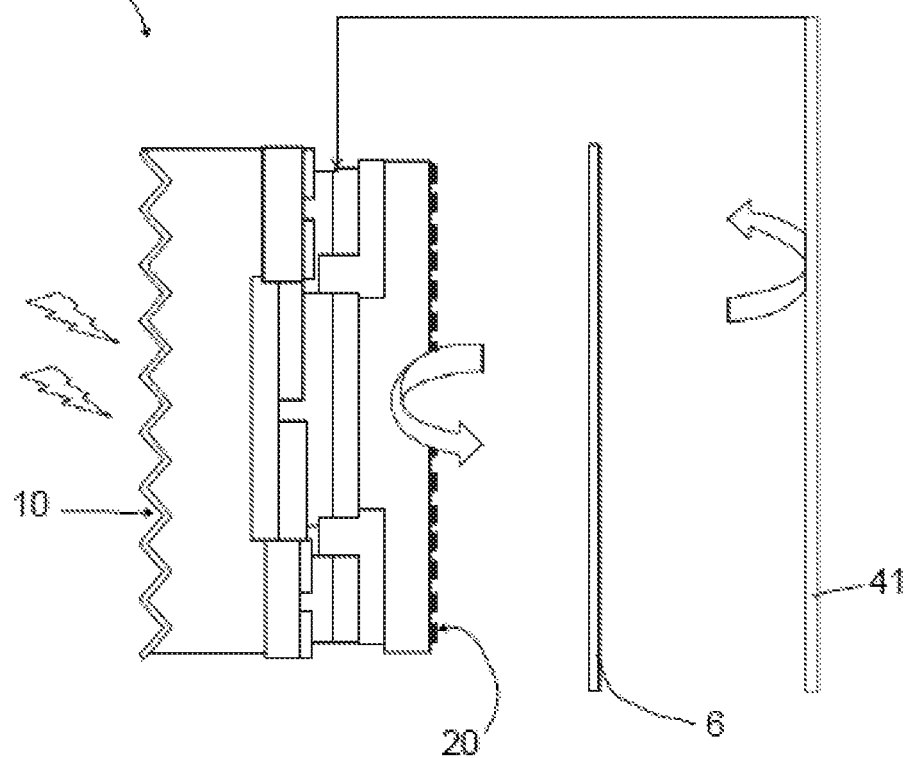

SUBSTRATE-ELECTRODE (SE) INTERFACE ILLUMINATED PHOTOELECTRODES AND PHOTOELECTROCHEMICAL CELLS

This application claims the benefit of European Patent Application EP15382658.1 filed on Dec. 23, 2015.

The present disclosure relates to photoelectrodes for photoelectrochemical cells, particularly filter-press photoelectrochemical cells. The disclosure further relates to methods of manufacturing such photoelectrodes and to photoelectrochemical cells including the same.

BACKGROUND

Photoelectrochemical cells for oxidation and reduction (redox) reactions are well known. In a photoelectrolytic cell, e.g. $CO_2$ can be reduced on the cathode while the oxygen evolution takes place on the anode. Electrochemical reduction of carbon dioxide is well-known to produce organic compounds. Alternatively, water can be reduced to hydrogen in which case hydrogen is obtained in the cathode whereas oxygen is evolved at the anode. Water splitting under irradiation is a well-known route to produce hydrogen as a clean chemical fuel.

Photoelectrodes based on absorbers made of semiconductors with band gaps in the central range of the solar spectrum are known to optimize photon absorption efficiency. Such photoelectrodes have been used to increase productivity in photoelectrochemical processes to reach higher current densities than those obtained with metal oxide absorbers that typically have higher band gaps (e.g. broadband semiconductors such as $TiO_2$) and greater losses caused by a higher recombination of the photogenerated carriers and lower diffusion lengths of the minority carriers.

In this sense, photoelectrodes based on semiconductor materials such as silicon, III-V compounds (GaAs or GaP among others) or chalcogenides (CIS or Kesterites among others) have been used in photoelectrochemical processes to increase current densities. The correlation of their band gaps with the solar spectrum, the passivation options to obtain small surface recombination velocities with the resulting increase in the lifetime of the minority carriers and, at the same time, the possibility to control a doping level permit to achieve considerably higher current densities than those obtained with metal oxide absorbers with larger band gaps and increased open circuit voltage, close to their maximum theoretical values. Examples of current densities that were obtained using different absorbers may e.g. be $TiO_2$ photoelectrodes: 1.2 $mA/cm^2$, and silicon based photoelectrodes: 18 $mA/cm^2$.

Usually such photoelectrodes have been used with light incident on the Electrolyte-Electrode interface (EE illumination) i.e. the photoelectrocatalytic reaction takes place in the illuminated side of the photoelectrode and therefore cannot be efficiently used, for example, as photoelectrodes on photoelectrochemical cells (PEC) e.g. with a filter-press configuration to develop photoelectrocatalytic systems. In these systems, the photons need to cross the electrolyte solution with the consequent loss of part of them by absorptions in the electrolyte solution. A high transmittance electrolyte in the energy range of the solar spectrum is thus needed. Furthermore, the use of layers of electrocatalysts to activate the photocatalytic processes constitutes another limiting factor of photon absorption as it is a limiting factor for the effective transmittance of the system. Further, the deposition of layers of electrocatalysts at the interface where it is illuminated constitutes a limiting factor to optimize both passivation treatments to increase lifetime of minority carriers as well as to optimize the system design (from an optical viewpoint) e.g. by providing an antireflective layer.

Other known systems use silicon as a wafer/substrate with light incident on the Substrate-Electrode interface (SE illuminated). However, under SE illumination the electrode-electrolyte interface is on the opposite side with respect to the incident light and due to the thickness of the absorber (that is usually larger than the carrier diffusion length) most electrons are lost by recombination near the substrate surface. The photocurrent generated by e.g. a SE-illuminated silicon (Si) substrate is thus limited.

It is an object of the present disclosure to provide photoelectrodes for photoelectrochemical cells, e.g. with a filter-press configuration, that are able to work under SE illumination and that at least partially overcome the prior art drawbacks increasing density of current generated.

SUMMARY

In a first aspect, a photoelectrode for a photoelectrochemical cell is provided. The photoelectrode extends from a front end surface to an opposing back end surface, wherein the front end surface in use is irradiated with an incident light and the back end surface in use contacts an electrolyte of the photoelectrochemical cell. The photoelectrode comprises a back-contact solar cell extending from a solar cell front surface that in use constitutes the photoelectrode front end surface to be irradiated with incident light to an opposing solar cell back surface facing the back end surface, wherein the solar cell back surface comprises emitter and collector contacts. The emitter and collector contacts are spaced apart by first openings of the solar cell back surface and the emitter and collector contacts are respectively collected in an emitter busbar and a collector busbar. The photoelectrode further comprises a contact passivation layer covering the solar cell back surface to separate the emitter and collector contacts from the electrolyte when in use. The contact passivation layer further comprises second openings in correspondence with the first openings of the solar cell back surface. The photoelectrode further comprises a resin layer covering the openings and a portion of the contact passivation layer such that in use only charge carriers from the emitter contacts traverse the contact passivation layer in its way to the electrolyte while charge carriers from the collector contacts are collected in the collector busbar. The photoelectrode further comprises an electrocatalyst layer covering respectively the resin layer, the contact passivation layer, or both, wherein the electrocatalyst layer constitutes the back end surface that in use contacts the electrolyte.

According to this aspect, a SE illuminated photoelectrode suitable for a photoelectrochemical cell is thus provided. To do this, the disclosure starts from a known back-contact solar cell that is insulated (waterproofed) in a special manner so as to be able to work in contact with an electrolyte. Such a special insulation starts with a coating with a passivation layer so as to protect the contacts of the solar cell from corrosion in case of contact with the electrolyte and the provision of a resin layer in correspondence with the collector contacts. This way, charge carriers flow from the collector contacts, i.e. the contacts that are covered by the resin, cannot traverse the passivation layer to contact the electrolyte of the photoelectrochemical cell, but they are collected in the collector busbar. Put in other words, the zones that are covered by the resin correspond to collector zones whereas the zones not covered by the resin correspond to emitter zones.

As used herein the term "busbar" should be understood as a region, e.g. a metallic strip or bar, in which electrical contacts can be collected or concentrated to further being transferred to e.g. a counterelectrode.

In some examples, the contact passivation layer may comprise titanium (Ti). In others, the contact passivation layer may comprise a metal selected from chromium (Cr), aluminium (Al), zinc (Zn), its alloys and combinations thereof.

The special insulation further comprises the provision of an electrocatalyst layer to facilitate/fasten the interaction of the charge carriers from the emitter zones (contacts not covered by the resin layer) of the photoelectrode with the reactants in the electrolyte when incident light strikes on the opposite surface (front end surface) of the photoelectrode. By doing this, a back-contact solar cell or substrate-electrode interface (SE) illuminated cell can be used inside a photoelectrochemical cell with an electrolyte for carrying out electrochemical redox reactions.

Throughout the present disclosure a back-contact solar cell should be understood as a solar cell in which the emitter and collector contacts are both provided at the same side (back side) that is opposite to the side on which the light irradiates (front side). This means that inside a photoelectrochemical cell the electrode-electrolyte interface is on the opposite side with respect to the incident light. Examples of known back-contact solar cells may comprise e.g. interdigitated back contact cells (IBC).

The fact that the contacts are on the back surface (opposite to that irradiated with light) ensures that the whole front surface of the photoelectrode is an effective photon absorption surface. This way, photons from incident light no longer need to cross an electrolyte solution thus avoiding loss of part of them by absorptions in the electrolyte solution. This also affects the type of electrolyte that may be used as a high transmittance electrolyte in the energy range of the solar spectrum is no longer needed. It is thus cost-effective.

Another aspect of using SE illumination is that a greater degree of freedom, at least in terms of structure and material of the front end surface, is provided at least when compared to the structure and material of photoelectrodes for EE illumination. This is because when SE or back illumination is used, the front end surface does not need to contact the electrolyte thus corrosion of the front end surface is reduced thus extending lifetime of the photoelectrode.

The use of SE illumination further promotes an increase in the effective area of the electrode as the totality of the back end surface of the photoelectrode can contact the electrolyte. In addition, all contacts (emitters and collectors) are provided at the back surface thus simplifying their collection and preventing shading losses.

In some embodiments, the back-contact solar cell may comprise a semiconductor substrate having a substrate front surface defining the solar cell front surface, and an opposing substrate back surface facing the solar cell back surface.

In these embodiments, the semiconductor substrate may be selected from n-type and p-type. The back-contact solar cell may further comprise one or more $n^+$-type and $p^+$-type doped regions. The $n^+$-type and $p^+$-type doped regions may be alternately provided on the substrate back surface, wherein a distribution of the $n^+$-type and $p^+$-type doped regions depends on the semiconductor substrate type. The back-contact solar cell may further comprise a metal collector covering the $n^+$-type and $p^+$-type doped regions to define the emitter and collector contacts such that in use the metal collector collects the emitter regions in the emitter busbar and the collector regions in the collector busbar. In these cases, the first openings of the solar cell back surface may be provided in the metal collector in correspondence with junctions between $n^+$-type and $p^+$-type doped regions so as to separate the emitter contacts from the collector contacts. In these cases, the metal collector constitutes the solar cell back surface.

As used herein, a p-type semiconductor is understood as containing mostly free holes, whereas an n-type semiconductor is understood as containing mostly free electrons. Furthermore, $n^+$ denotes an n-type semiconductor with a high doping concentration and $p^+$ denotes a p-type semiconductor with a high doping concentration.

The provision of one or more $n^+$-type and $p^+$-type doped regions on the substrate back surface allows e.g. an alternating distribution of holes and electrons thus optimizing current densities and open circuit voltages. And the provision of a metal collector covering the doped regions allows the collection of emitter contacts and collector contacts independently at each busbar thus ensuring a back end surface free of electrical contacts. This enhances passivation of the back end surface, i.e. optimizes surface recombination velocity thus extending lifetime of charge carriers travelling to the doped regions.

In some embodiments, the solar cell may further comprise a first passivation layer arranged between the metal collector and the doped regions. The first passivation layer may be provided with further openings in correspondence with each doped region such that in use the further openings allow transit of charge carriers from the doped regions to the metal collector. The provision of a first passivation layer avoids, or at least reduces, the occurrence of recombinations at the surface of the doped regions. This enhances efficiency of photon withdrawing from incident light. In some examples, the first passivation layer may comprise silicon dioxide ($SiO_2$), aluminium oxide ($Al_2O_3$) or combinations thereof. Alternatively, silicon oxynitrides or nitrides, e.g. $Si_3N_4$ may be foreseen.

In some embodiments, the photoelectrode may further comprise an antireflective layer covering one or more portions of the solar cell front surface that in use is irradiated with the incident light. The provision of an antireflective layer increases effectiveness of photon absorption. In some of these cases, the whole solar cell front surface may be covered with the antireflective layer.

In some of these embodiments, the antireflective layer may comprise aluminium oxide ($Al_2O_3$). In more examples, the antireflective layer may comprise hafnium-oxide ($HfO_2$), silicon monoxide (SiO), zirconium dioxide ($ZrO_2$), tantalum oxide ($Ta_2O_5$), cerium fluoride ($CeF_2$), magnesium oxide (MgO), magnesium fluoride ($MgF_2$), titanium dioxide ($TiO_2$). In some of these embodiments, the antireflective layer may comprise a roughened surface that may be made by e.g. nanostructuration techniques.

In some embodiments, the photoelectrode may further comprise a second passivation layer arranged between the electrocatalyst layer and respectively the resin layer or the contact passivation layer. In some examples, the second passivation layer may comprise titanium dioxide ($TiO_2$). In more examples, other metal oxides such as e.g. aluminium oxide ($Al_2O_3$) and silicon oxide ($SiO_2$) may be foreseen. The second passivation layer reinforces the already existing contact passivation layer provided to enhance stability against corrosion of the photoelectrode. And in further alternatives, electron (or holes) conductive resins or polymers may be foreseen.

In some embodiments, the second passivation layer may have a thickness ranging from 1 and 250 nm depending on the dielectric properties of the metal oxide, e.g. $TiO_2$, $SiO_2$, $Al_2O_3$. When using $Al_2O_3$ or $SiO_2$, in circumstances, due to tunnel effect, thicknesses around 1-5 nm may be foreseen.

The second passivation layer may be deposited using any of the known deposition techniques in the art such as e.g. atomic layer deposition (ALD), chemical vapor deposition (CVD), pulsed laser deposition (PLD), sputtering, Sol-gel processes, blade coating, screen-printing, or aerography. In some embodiments, the second passivation layer may further comprise doping elements such as e.g. aluminium (Al), niobium (Nb) or vanadium (V).

In some embodiments, the resin layer may be made of a polymer with high chemical and thermal resistance. In some cases, a polyamic acid formulation may be foreseen. E.g. Durimide®, commercially available from Fujifilm Electronic Materials. In some of these examples, the resin layer may have a thermal resistance equal to or higher than 200° C. and a volume resistivity higher than $10^{16}$ Ohm·cm.

In some embodiments, the electrocatalyst may be selected from a metal, metal oxide or metal hydroxide, metal nitride, metal phosphide or a conductive polymer. The electrocatalyst may be selected as a function of the reaction to be carried out inside the photoelectrochemical cell which is an evident selection to those skilled in the art.

In some embodiments, the resin layer may cover a portion of the contact passivation layer that is in correspondence with the collector contacts such that in use only electrons from the emitter contacts traverse the contact passivation layer in its way to contact the electrolyte of the photoelectrochemical cell while positive charge carriers (holes) from the collector contacts are collected in the collector busbar. In these cases, the photoelectrode is a cathode. The holes of the collector contacts collected in the collector busbar in use can thus be transmitted to a counterelectrode (anode) forming part of the photoelectrochemical cell.

In more embodiments, the resin layer may cover a portion of the contact passivation layer that is in correspondence with the collector contacts such that in use only positive charge carriers (holes) from the emitter contacts traverse the contact passivation layer in its way to contact the electrolyte of the photoelectrochemical cell while electrons from the collector contacts are collected in the collector busbar. In these cases, the photoelectrode is an anode. The electrons of the collector contacts collected in the collector busbar in use can be transmitted to a counterelectrode (cathode) forming part of the photoelectrochemical cell.

In a further aspect, a photoelectrochemical cell may be provided. The photoelectrochemical cell comprises a first photoelectrode substantially as hereinbefore described. The first photoelectrode is arranged such that in use an incident light irradiates its front end surface and its back end surface contacts an electrolyte.

Inside the photoelectrochemical cell, an overall process may thus consist of two main parts: light absorption by the solar cell resulting in charge carrier generation (emitter and collector contacts), and the utilization of such excited photo carriers to drive catalytic reactions when contacting the electrolyte. The inventors have found that using photoelectrodes substantially as hereinbefore described an improved efficiency of examples of photoelectrochemical cell is achieved.

In a still further aspect, a method of manufacturing a photoelectrode substantially as hereinbefore described is provided. The method comprises, providing a back-contact solar cell, providing a contact passivation layer covering the solar cell back surface, the contact passivation layer being provided with second openings in correspondence with the first openings. The method further comprising providing a resin layer to seal the openings, wherein the resin layer further covers a portion of the contact passivation layer that is in correspondence with the collector contacts, and providing an electrocatalyst layer covering respectively the resin layer and the contact passivation layer.

BRIEF DESCRIPTION OF THE DRAWINGS

Non-limiting examples of the present disclosure will be described in the following, with reference to the appended drawings, in which:

FIG. 1b shows an exploded view of FIG. 1a;

FIG. 3 shows a top view of the photocathode of FIG. 2a being arranged in a photoelectrochemical cell;

DETAILED DESCRIPTION

Throughout the following figures the same reference numbers will be used for matching parts.

Figure 1A:
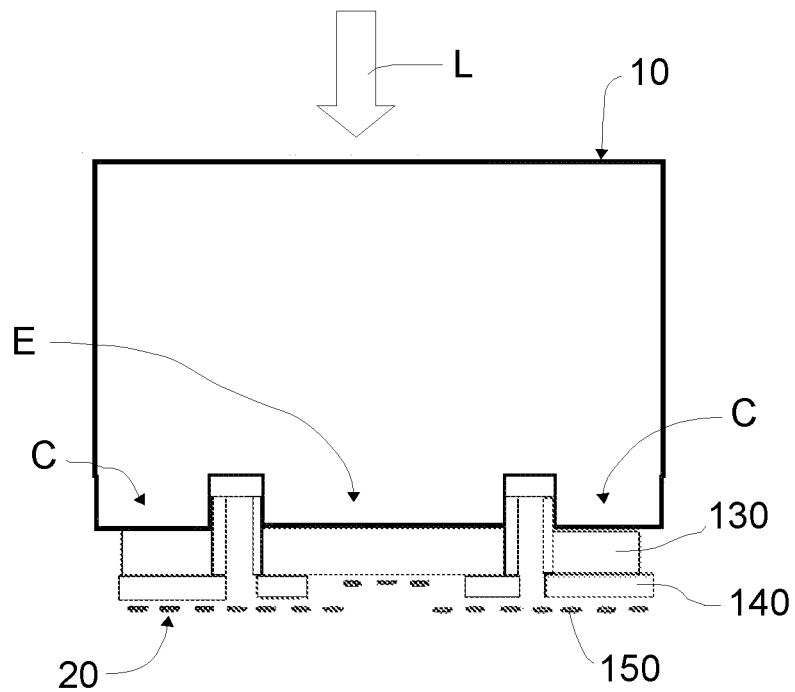
FIG. 1a shows a cross-sectional view of a photoelectrode according to an embodiment.
Figure 1B:
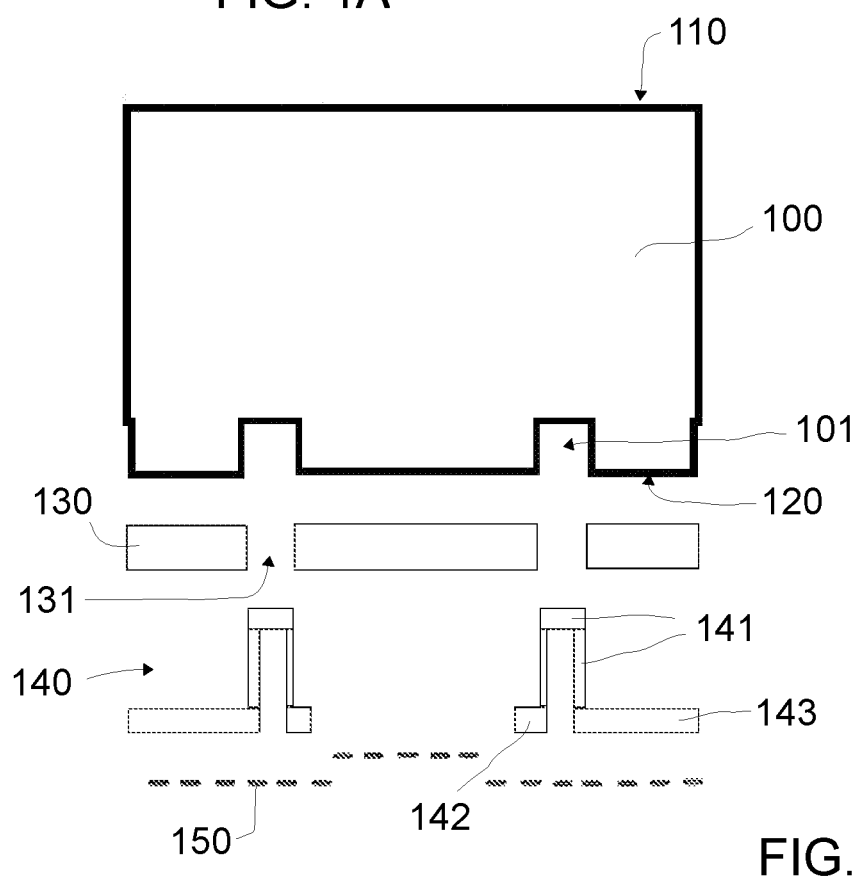

FIGS. 1a and 1b show cross-sectional views of a photoelectrode according to an embodiment.

The photoelectrode may extend from a front end surface 10 to an opposing back end surface 20. The front end surface 10 in use is irradiated with an incident light L and the back end surface 20 in use contacts an electrolyte of the photoelectrochemical cell.

As shown in FIGS. 1a and 1b, the photoelectrode may comprise a back-contact solar cell 100 that may extend from a solar cell front surface 110 to an opposing solar cell back surface 120. The solar cell front surface 110 may define the photoelectrode front end surface 10 that in use is irradiated with incident light L.

In this embodiment, the solar cell back surface 120 may comprise emitter contacts E and collector contacts C. The contacts E and C may be spaced apart by first openings 101 of the solar cell back surface 120. The emitter E and collector C contacts may be interdigitated, i.e. arranged in alternating rows. See FIG. 2c. The emitter E and collector C contacts may be arranged in an interdigitated manner defining "fingers" and may be collected at opposite ends, the emitter contacts E in an emitter busbar 111 or pad area and the collector contacts C may be collected in a collector busbar 121 or pad area. In alternative embodiments, other ways of alternatively arranged the emitter and collector contacts may be foreseen as long as areas of emitter contacts can be identified/distinguished from areas of collector contacts and the collector contacts can be collected/concentrated for further transmission (in use) to e.g. a counterelectrode.

The photoelectrode may further comprise a contact passivation layer 130 covering the solar cell back surface 120. The contact passivation layer separates the emitter E and collector C contacts of the solar cell back surface 120 from an electrolyte when the photoelectrode is used in a photoelectrochemical cell. This reduces corrosion of the contacts provided at the solar cell back surface. In these cases, the contact passivation layer 130 may comprise titanium (Ti). Alternatively, the contact passivation layer may comprise chromium (Cr), aluminium (Al), zinc (Zn) or its alloys.

The contact passivation layer 130 may further comprise second openings 131 in correspondence with the first openings 101 of the solar cell back surface 120.

A resin layer 140 may further be provided to seal the openings 101 and 131. In the embodiment of FIGS. 1a and 1b, the resin layer may comprise a portion 141 covering an inside of the first 101 and second 131 openings and another portion 142 covering neighbouring areas at or near a mouthpiece of the second openings 131. In these cases, the resin layer may further comprise a portion 143 covering part of the contact passivation layer that is in correspondence with the collector contacts C. This way, in use, only charge carriers from the emitter contacts E traverse the contact passivation layer 130 in their way to the electrolyte while charger carriers from the collector contacts C are collected in the collector busbar (see FIG. 2c). In alternatives, the portion of the resin layer that seals the openings may have other distributions, e.g. a plug or a straight layer, as long as it seals the openings.

In all cases, the resin layer may comprise a polyamic acid formulation, commercially available from Fujifilm Electronic Materials as Durimide®.

Further in this embodiment, an electrocatalyst layer 150 may cover the resin layer 140, the contact passivation layer 130, or both respectively. The electrocatalyst layer 150 thus constitutes the photoelectrode back end surface 20 that in use contacts the electrolyte.

Figure 2A:
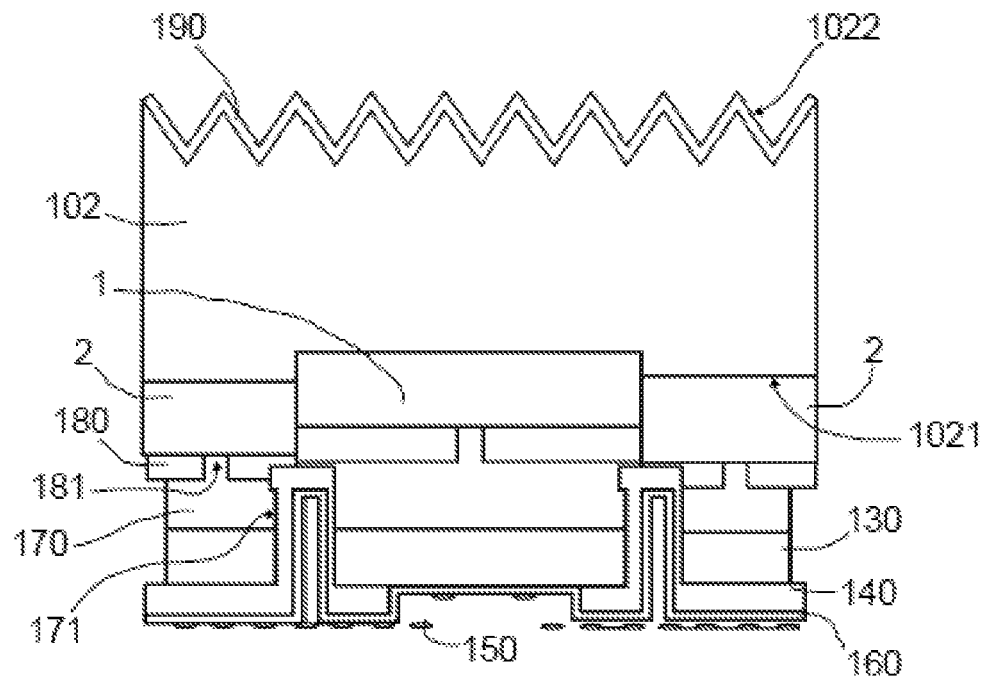
FIGS. 2a and 2b show respectively a cross-sectional view of a photocathode and a photoanode according to an embodiment.
Figure 2B:
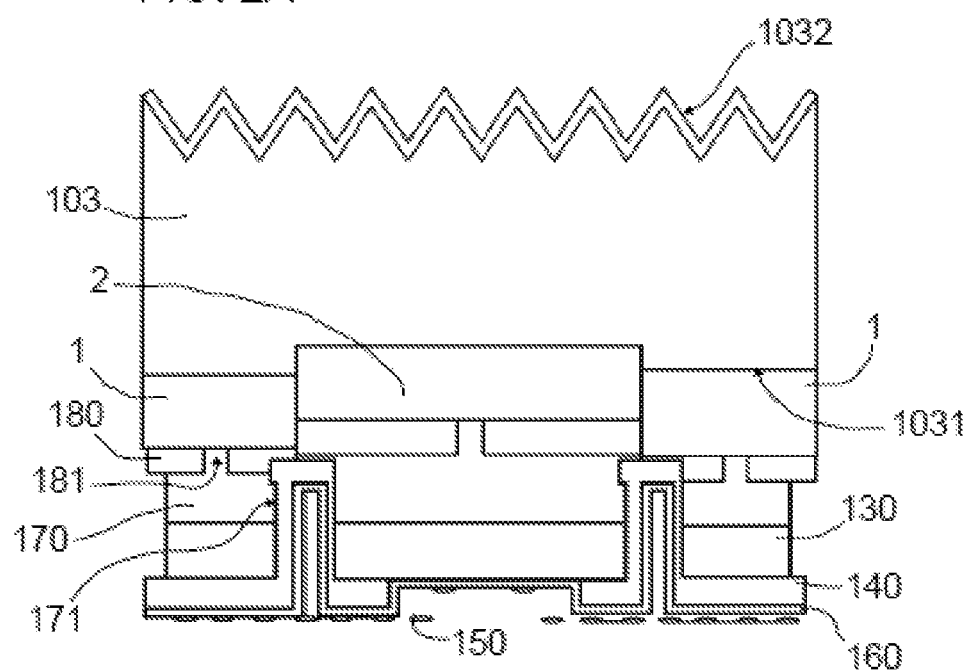

FIGS. 2a and 2b show respectively cross-sectional views of a photocathode and a photoanode according to another embodiment. The embodiment of FIGS. 2a and 2b differs from that of FIGS. 1a and 1b in that a passivation layer 160 may be arranged between the electrocatalyst layer 150 and the resin layer 140 or the contact passivation layer 130 respectively. In these embodiments, the passivation layer 160 may comprise titanium dioxide ($TiO_2$). In alternative embodiments, the passivation layer may comprise other metal oxide such as e.g. aluminium oxide ($Al_2O_3$), silicon dioxide ($SiO_2$) or molybdenum disulphide ($MoS_2$). In still further alternatives, electron (or holes) conductive resins or polymers may be foreseen.

The embodiment of FIGS. 2a and 2b further differs from that of FIGS. 1a and 1b in that a back-contact solar cell comprising a semiconductor substrate or wafer is shown.

The semiconductor substrate may be a monocrystalline or polycrystalline silicon (c-Si) semiconductor substrate. In FIG. 2a a p-type c-Si semiconductor substrate 102 is shown and in FIG. 2b an n-type c-Si semiconductor substrate 103 is shown. In alternative embodiments, other semiconductor substrates or wafers able to absorb incident light and create free charge carriers may be foreseen. E.g. amorphous silicon, cadmium telluride (CdTe), III-V compounds such as gallium arsenide (GaAs) or gallium phosphide (GaP) or chalcogenides such as CIS or kesterites or copper-indium-gallium-diselenide (CIGS) among others.

In both cases, the semiconductor substrate or wafer may extend from a substrate front surface 1022, 1032 facing the solar cell front surface (see FIGS. 1a and 1b), to an opposing substrate back surface 1021, 1031 facing the solar cell back surface. The substrate back surface 1021, 1031 may be provided with $n^+$-type doped regions 1 and $p^+$-type doped regions 2 alternately arranged e.g. interdigitated so as to form rows of contacts (in correspondence with doped regions). In these cases, the $n^+$-type 1 and $p^+$-type 2 doped regions may be covered by a metal collector 170 that may be provided with openings 171 in correspondence with junctions between the $n^+$-type 1 and $p^+$-type 2 doped regions. The metal collector may thus have a geometry which matches that of the doped regions. In this embodiment, the metal collector may be made, e.g., of aluminum. Alternatively, other metals, conductive polymers or conductive metal oxides such as AZO or ITO may be foreseen.

Further in this embodiment, as shown in FIGS. 2a and 2b, a passivation layer 180 may be provided between the doped regions 1, 2 and the metal collector 170. The passivation layer 180 may be provided with openings 181 in correspondence with the doped regions 1, 2 such that in use, the openings 181 allow transit of charge carriers from the doped regions 1, 2 to the metal collector 170. In this case the passivation layer may be made of, e.g., dioxide silicon ($SiO_2$) or aluminum oxide ($Al_2O_3$).

In the embodiment of FIG. 2a, the resin layer 140 may cover a portion of the contact passivation layer 130 that is in correspondence with the $p^+$-type doped regions 2. In these cases, only charge carriers from the $n^+$-type doped regions 1 may traverse the metal collector 170 and the contact passivation layer 130 in its way to contact an electrolyte of the photoelectrochemical cell. Further in these cases, charge carriers from the $p^+$-type doped regions 2 may be captured by the metal collector 170 and collected in the collector busbar (see FIG. 2c) so as to be configured for being transmitted to a counterelectrode that may be provided within the photoelectrochemical cell. This means that junctions p/p+(semiconductor type/doped region type) may be isolated from the electrolyte and junctions $p/n^+$ may be in electrical contact with the electrolyte for the corresponding charges to be transferred from these emitter contacts to the electrocatalyst. The photoelectrode is thus a cathode.

In this embodiment, the electrocatalyst layer 150 may be made from a catalyst selected from hydrogen evolution reaction (HER) catalysts, able to reduce water into Hydrogen, or $CO_2$ reduction catalysts, able to reduce $CO_2$ into products such as CO, $CH_4$, HCOOH and $C_2H_4$. In alternative cases, other catalysts may be foreseen such as, e.g. nitrates and nitrites reduction catalysts in water solutions.

In the embodiment of FIG. 2b, the resin layer 140 may cover a portion of the contact passivation layer 130 that is in correspondence with the $n^+$-type doped regions 1. In these cases, only charge carriers from the $p^+$-type doped regions 2 may traverse the metal collector 170 and the contact passivation layer 130 in its way to contact an electrolyte of the photoelectrochemical cell. Further in these cases, charge carriers from the n+-type doped regions 1 may be captured by the metal collector 170 and collected in the collector busbar so as to be configured for being transmitted to a counterelectrode also provided within the photoelectrochemical cell. This means that junctions n/n+ (semiconductor type/doped region type) may be isolated from the electrolyte and junctions n/p+ may be in electrical contact with the electrolyte for the corresponding charges to be transferred from these emitter contacts to the electrocatalyst. The photoelectrode is thus an anode.

In this embodiment, the electrocatalyst layer 150 may be made from a catalyst selected from oxygen evolution reaction (OER) catalysts. OER catalysts are able to oxide water into oxygen. Examples of these catalysts may comprise Nickel (Ni), Iron-nickel alloy (Ni—Fe), molybdenum (Mo), iron (Fe), iridium (Ir), tantalum (Ta), ruthenium (Ru), and its alloys, hydroxides, oxides. In alternative cases, other catalysts may be foreseen, e.g. catalysts for electro-oxidation of pollutants in water solutions.

In all cases, the electrocatalyst layer may depend on the photoelectrode, if it is a photoanode or a photocathode, and in the reaction to be carried out in the electrochemical cell, i.e. the target molecule to be reduced or oxidized. In general terms, if the photoelectrode is a photoanode, then good oxygen evolvers are desired such as OER catalysts able to oxide e.g. water into oxygen. If the photoelectrode is a photocathode, then electrocatalysts able to reduce water to hydrogen (HER catalysts) are desired. Alternatively, electrocatalysts able to reduce $CO_2$ to products such as Sn when the $CO_2$ is reduced to formate are desired.

In further cases, the electrocatalyst may be selected from a metal, metal oxide or metal hydroxide, metal nitride, metal phosphide or a conductive polymer. In general, the aim is to provide an electrocatalyst that is suitable for the desired oxidation or reduction reaction. The electrocatalyst may be deposited by several methods, directly onto the surface of the electrode, onto a protective coating (as $TiO_2$) or onto a more porous and conductive substrate, as a metallic mesh or foam, to increase the active surface area, thus enhancing the electronic transfer at the contact surface with the electrolyte.

The embodiments of FIGS. 2a and 2b further differ from that of FIGS. 1a and 1b in that the substrate front surface 1022, 1032 may be textured. In these cases, the textured may be in the shape of an inverted pyramid. Other alternative shapes may be foreseen. An aspect of providing a textured shape it reduces reflection by increasing the chances of reflected light bouncing back into the surface, rather than out to the surrounding air. This means that the effective photon absorption is thus increased. In these cases, the inclined path created by the inverted pyramid shape increases effective light absorption.

And the embodiments of FIGS. 2a and 2b also differs from that of FIGS. 1a and 1b in that an antireflective layer 190 may be provided covering the substrate front surface 1022, 1032. In these embodiments, the antireflective layer may comprise aluminium oxide ($Al_2O_3$). Alternatively, other antireflective materials may be used such as hafnium-oxide ($HfO_2$), silicon monoxide (SiO), zirconium dioxide ($ZrO_2$), tantalum oxide ($Ta_2O_5$), cerium fluoride ($CeF_2$), magnesium oxide (MgO), magnesium fluoride ($MgF_2$) or titanium dioxide ($TiO_2$). The provision of an antireflective layer enhances photon absorption at least by reducing reflectivity of incident light.

Further in these embodiments, the antireflective layer may be provided covering the whole substrate front surface. In more cases, the substrate front surface may be only partly covered by an antireflective layer.

An antireflective layer substantially as hereinbefore described may further be provided in substrates having a flat front surface.

All photoelectrodes substantially as hereinbefore described may be used in a photoelectrochemical cell.

Figure 2C:
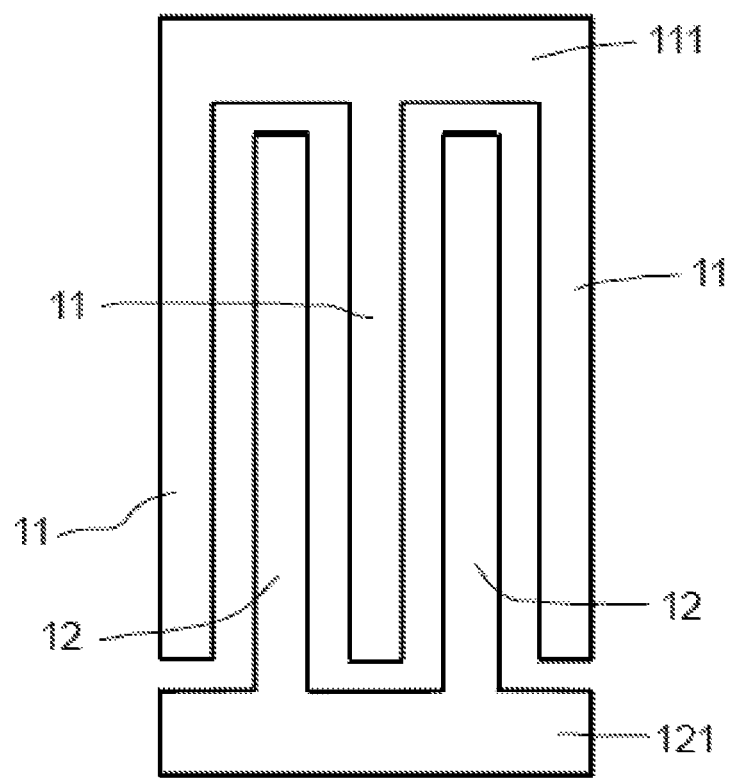
FIG. 2c show a top view of a scheme of interdigitated of emitter and collector contacts.

FIG. 2c shows a top view of the interdigitated emitter and collector contacts of any of FIG. 2a or 2b. In this figure the interdigitated arrangement of doped regions may clearly be identified as rows or fingers 11, 12 (corresponding to the emitter and collector contacts) being alternately arranged and extending respectively up to a busbar or pad area 111, 121, where the effective electrical current can be collected in order to be transferred to a counterelectrode. In this embodiment, the "busbar" or pad areas 111, 121 are provided at opposite ends along a longitudinal length of the doped regions of the solar cell.

FIG. 3 shows an embodiment photoelectrochemical cell that may comprise a compartment (e.g. a tank) 3 filled with an electrolyte. In a wall of the compartment 3 a first photoelectrode 5 substantially as that shown in FIG. 2a (i.e. a photocathode) may be provided. In alternative cases, the first photoelectrode may be substantially as shown in any of FIG. 1a, 1b or 2b:

Further in the embodiment of FIG. 3, a second electrode 4 may be arranged inside the compartment 3 spaced apart from the first photoelectrode 5. In this case, the second electrode 4 may be an anode. The first photoelectrode and the second electrode may be electrically connected to each other thus producing an expected chemical reaction, as a function of the type of electrodes and electrolyte of the cell. An ion-exchange separator 6 may further be provided within the electrolyte spaced apart from the first photoelectrode 5 and the second electrode 4. The provision of the ion-exchange separator may thus divide the compartment into two sub-compartments. At each sub-compartment a different or the same, depending on circumstances, electrolyte may be used. For example, a catholyte and an anolyte may be foreseen.

Generally, the ion-exchange separator may be a membrane chemically resistant to anolytes and catholytes thus depends on the reaction to be carried out within the photoelectrochemical cell. In some cases, cation ion exchange membranes may be used. In others, anion exchange membranes may be used.

Examples of cation ion exchange membranes may comprise: polytetrafluoroethylene (PTFE) backbone with perfluorinated side chains of different lengths attached to the backbone through ether linkages and terminated by sulfonic acid (—SO3H) by the following structure,

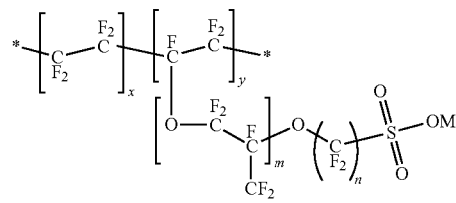

wherein, m is an integer 0-3 (preferably m=1, 2, or 3), n is an integer higher than 2 (preferably 2 or 3), x and y are each an integer of 1-100 (preferably an integer of 3-80), M is H or an alkali metal or alkaline earth metal such as Na, K, Li, Ca, Mg respectively;

Examples of anion exchange membranes may be composed of a polymer backbone with tethered quaternized amines as functional groups to facilitate the movement of free OH— ions, may be used in present disclosure include; trimethyl ammonium (TMA), methyl-imidazolium, penta-methyl-guanidinium, and diazabicyclo[2,2,2]octane and derivatives;

Other separators may be foreseen such as nanofiltering membranes or ceramic based ion conductive membranes based on metallic oxides.

An enlarged detail of FIG. 3 shows the cross-sectional view of the first photoelectrode. This cross-sectional view differs from that of FIG. 2a in that the passivation layer (reference 160 of FIG. 2a) may be removed.

As further shown in the enlarged detail of FIG. 3, the photocathode may be arranged with its antireflective layer 190 facing an outer of the tank 3. And the photocathode may further be arranged with its electrocatalyst layer 150 facing an inside of the compartment 3 to contact an electrolyte solution that may be provided inside the compartment 3.

The enlarged detail of FIG. 3 also shows the ion-exchange separator 6 and contacts 41 of the second electrode 4. A connecting cable 7 may connect the contacts 41 of the second electrode 4 with the corresponding busbar (collector) of the first photoelectrode (photocathode).

In all cases, to introduce a photoelectrode substantially as hereinbefore in a photoelectrochemical cell comprising an electrolyte and produce electrical contact in the corresponding busbar, the photoelectrode may be provided inside a holder that allows electrical contact of the collector busbar and may contain gaskets to prevent short circuit by electrical contact with the electrolyte.

In more alternatives, the second electrode may also be a photoelectrode substantially as hereinbefore described, e.g. selected from the examples of FIG. 2a or 2b. In these cases, the semiconductor substrate type of the first photoelectrode may be different than the semiconductor type of the second photoelectrode. This means that, if the first photoelectrode comprises an n-type semiconductor substrate (photoanode), the second photoelectrode comprises a p-type semiconductor substrate (photocathode) and viceversa.

In some embodiments and depending on the expected reaction to be carried out within the photoelectrochemical cell, the electrolyte may comprise a salt of the formula $M_m X_n$ in which: M may be selected from magnesium, calcium, lithium, potassium and sodium; X may be selected from anions of weak or strong acids selected from carbonates, bicarbonates, sulfates, hydroxides and halides. In some of these cases, the electrolyte may be selected from $NaHCO_3$, $NaCO_2CH_3$, $KHCO_3$, $K_2CO_3$, $Na_2SO_4$, $K_2SO_4$, KCl and $KClO_4$.

In more embodiments, the supporting electrolyte may comprise a salt of the formula $M_m Y_n$ in which M may be selected from lithium, potassium, sodium, magnesium, calcium, and strontium; Y may be either a hydroxide ion or a counter ion coming from mineral acids selected from halides, sulphates, nitrates, chlorates and phosphates. In some of these cases, the electrolyte may be selected from NaOH, KOH, $H_2SO_4$, KCl, HCl, $H_3PO_4$, $NaHCO_3$, $K_2HPO_4$, $K_2SO_4$ and $Na_2SO_4$.

In more embodiments, other passivation layers or different electrocatalyst layers may be used to optimize the application of photoelectrodes substantially as hereinbefore described for different reactions to obtain different products in e.g. the photoreduction of water or $CO_2$ with increased productivity and efficiency whether acting as a photoanode or as a photocathode depending on the contact configuration.

In some embodiments, the incident light may be natural sunlight or any type of radiation source that comprises the absorption range of e.g. silicon. This means substantially any radiation source having a wavelength in the central range of the solar spectrum. Generally, incident light comprising a wavelength in the 350-1100 nm region may be used.

Experimental Procedure

To manufacture photoelectrodes substantially as hereinbefore described, the starting point was a back-contact solar cell of the IBC technology. The IBC solar cells were manufactured by the Polytechnic University of Catalonia (UPC).

The IBC solar cells that were used have an active area of 9 cm² (3×3 cm). This way, from each silicon wafer of a standard 4 inches size, four IBC solar cells were manufactured.

The IBC solar cells were made with a cross-section substantially as explained in connection with FIGS. 2a and 2b. This means that they included interdigitated n-type and p-type doped regions (references 1 and 2 of FIGS. 2a and 2b), i.e. arranged in rows or fingers (references 11 and 12 of FIG. 2c) along a length of the solar cell. The doped regions were covered by an aluminium layer having a thickness of 3-5 microns (metal collector 170 of FIGS. 2a and 2b).

The following examples were performed on these IBC solar cells:

Example 1—Photocathode for Hydrogen Evolution

The IBC solar cell comprised a p-type wafer made of silicon and having a thickness of 280 μm.

A titanium (Ti) layer of 25 nm was applied on top of the metal collector of the IBC solar cell. The titanium layer was applied by e-beam process.

A Durimide® layer (resin commercially available from e.g. Fujifilm) with a thickness of 2 microns was deposited to seal the openings and the p⁺-type doped regions as explained in connection with e.g FIG. 2a).

The Durimide® layer was applied by a spin coating process and after the spin coating process, a photolithography process was performed using a negative revealed mask to discover the areas in correspondence with n⁺-type doped regions and the emitter busbar such that in use charge carriers from the n⁺-type regions reach the electrolyte and electrical contact from the emitter busbar is allowed. A small overlap of about 50 microns in the collector busbar area was created to ensure insulation between the emitter and collector contacts.

A $TiO_2$ layer having a thickness of about 100 nm was deposited by atomic layer deposition (ALD) at 200° C. and 3700 cycles.

A platinum (Pt) layer having a thickness of about 2 nm was deposited on the $TiO_2$ layer by thermal evaporation and further annealed during 1 hour in vacuum conditions at 200° C.

The photoelectrode was irradiated using a solar simulator Solar Light 16S equipped with a 300W Xe-lamp and AM 1.5G filter to create a radiation flux of 100 mW cm⁻²

And the illuminated photoelectrode was in contact with an electrolyte containing 0.5M $H_2SO_4$.

Figure 4:
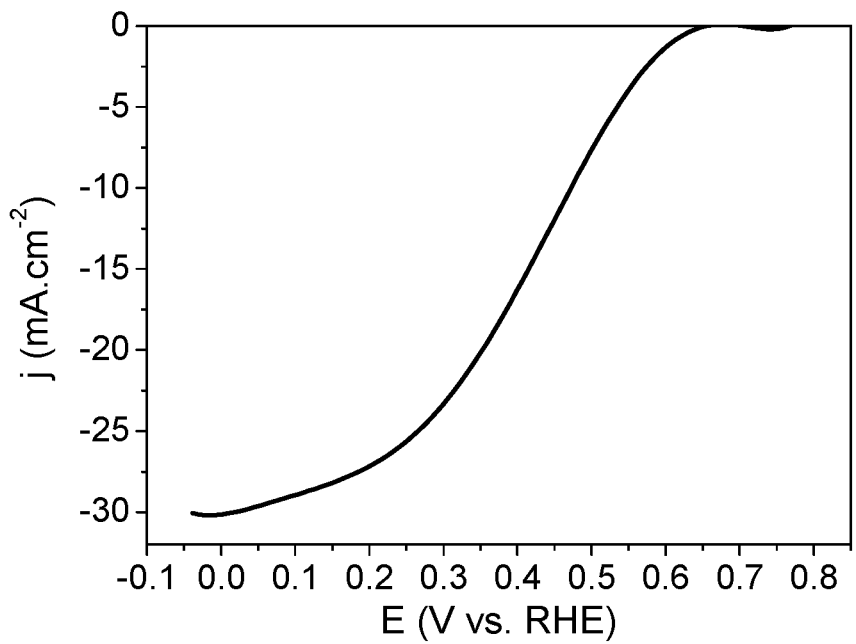
FIG. 4 shows the change of photocathode current density ($j_{cathode}$) as a function of individual photoelectrode potential in a photoelectrode according to example 1.

FIG. 4 shows the cyclic voltammetry of the photocathode where the change of photoelectrode current density ($j_{cathode}$) is shown as a function of individual photoelectrode potential. The scan rate was 20 mV/s. A hydrogen faradaic efficiency of 95% was estimated from volumetric measurements.

Example 2—Photoanode for Oxygen Evolution—Hydrogen Evolution or $CO_2$ Reduction Catalyst in the Counterelectrode The IBC solar cell comprised a n-type wafer made of silicon and having a thickness of 280 microns.

A titanium (Ti) layer of 30 nm was applied on top of the metal collector of the IBC solar cell. The titanium layer was applied by evaporation process.

A Durimide® layer (resin commercially available from e.g. Fujifilm) with a thickness of 5 microns was deposited to seal the openings and the $n^+$-type doped regions as explained in connection with e.g FIG. 2b).

The Durimide® layer was applied by a spin coating and after the spin coating process, a photolithography process was performed using a negative revealed mask to discover the areas in correspondence with $p^+$-type doped regions and the emitter busbar such that in use charge carriers from the $p^+$-type regions reach the electrolyte and electrical contact from the emitter busbar is allowed. A small overlap of about 50 microns in the collector busbar area was created to ensure insulation between the emitter and collector contacts.

A $TiO_2$ layer having a thickness of about 100 nm was deposited by atomic layer deposition (ALD) at 150° C., 3700 cycles.

A nickel (Ni) layer having a thickness of about 25 nm was deposited on the $TiO_2$ layer by thermal evaporation.

The photoelectrode was irradiated using a solar simulator Solar Light 16S equipped with a 300W Xe-lamp and AM 1.5G filter to create a radiation flux of 100 mW $cm^{-2}$.

And the illuminated photoelectrode was in contact with an electrolyte containing 1M KOH.

Figure 5A:
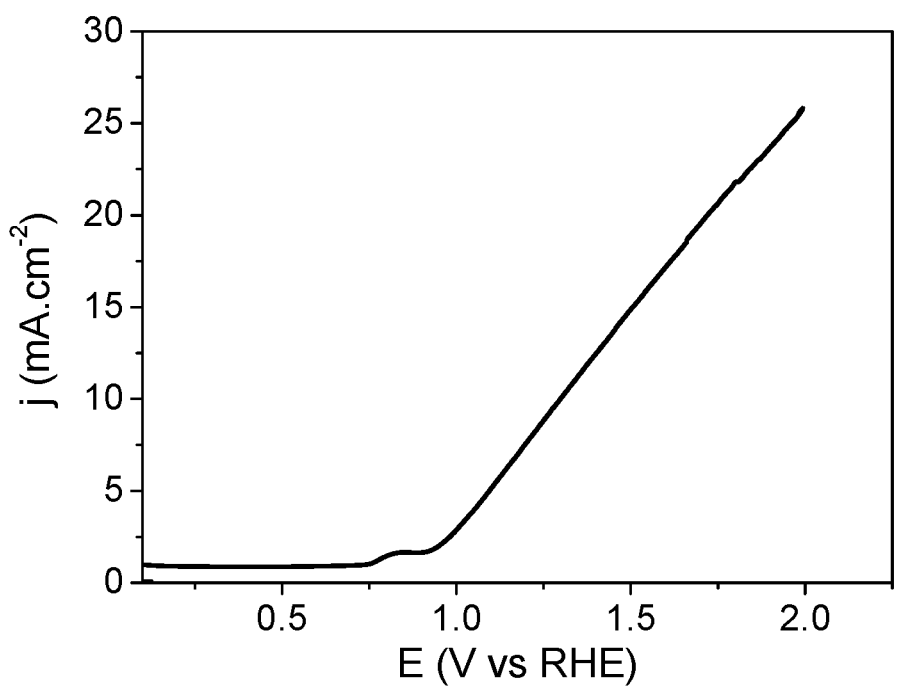
FIG. 5a shows the change of photoanode current density ($j_{anode}$) as a function of individual photoelectrode potential in a photoelectrode according to example 2.

FIG. 5a shows the cyclic voltammetry of the photoanode where the change of photoelectrode current density ($j_{anode}$) is shown as a function of individual photoelectrode potential. The scan rate was 20 mV/s.

Figure 5B:
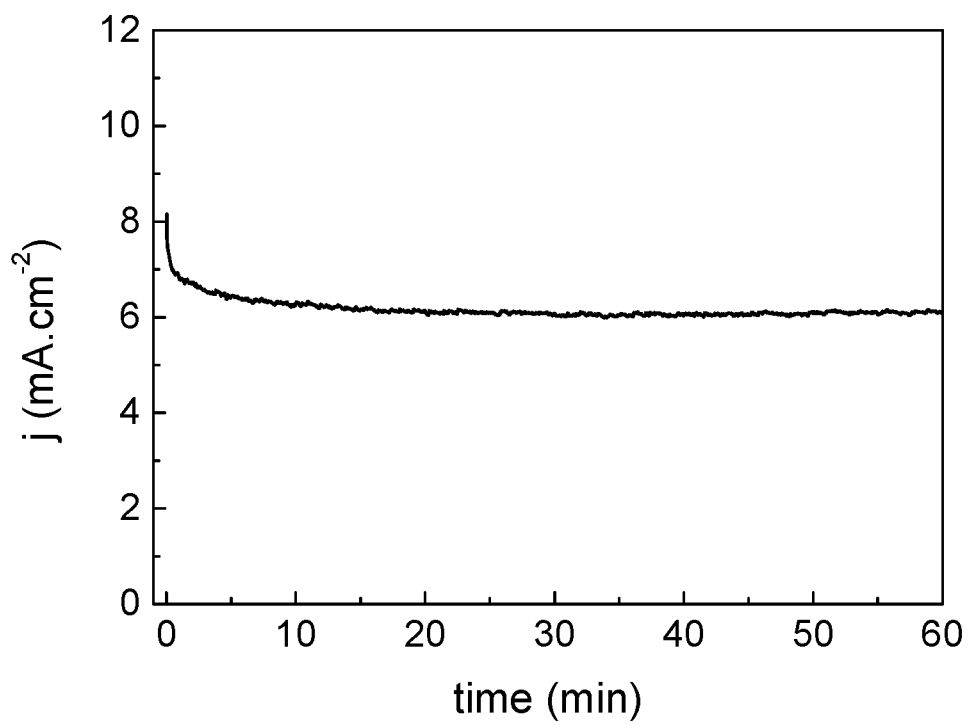
FIG. 5b shows the anode current density ($j_{anode}$) as a function of time when an absolute value of voltage is applied according to example 2.

A 1 hour stability test is shown in FIG. 5b. FIG. 5b shows the anode current density ($j_{anode}$) as a function of time. The voltage applied was 1.23 V vs. reversible hydrogen electrode (RHE). There is an initial loss of around 15-20% during the first 5 minutes, after that the photocurrent was stable for 1 hour.

Example 3—Photocathode for Hydrogen Evolution

The IBC solar cell comprised a p-type wafer made of silicon and having a thickness of 280 μm.

A titanium (Ti) layer of 30 nm was applied on top of the metal collector of the IBC solar cell. The titanium layer was applied by evaporation process.

A Durimide® layer (resin commercially available from e.g. Fujifilm) with a thickness of 5 microns was deposited to seal the openings and the $p^+$-type doped regions as explained in connection with e.g FIG. 2a).

The Durimide® layer was applied by a spin coating process and after the spin coating process, a photolithography process was performed using a negative revealed mask to discover the areas in correspondence with $n^+$-type doped regions and the emitter busbar such that in use charge carriers from the $n^+$-type regions reach the electrolyte and electrical contact from the emitter busbar is allowed. A small overlap of about 50 microns in the collector busbar area was created to ensure insulation between the emitter and collector contacts.

Platinum (Pt) layer having a thickness of about 5 nm was deposited on the resin layer by thermal evaporation and further drop-casting.

The photoelectrode was irradiated using a solar simulator Solar Light 16S equipped with a 300W Xe-lamp and AM 1.5G filter to create a radiation flux of 100 mW $cm^{-2}$ And the illuminated photoelectrode was in contact with an electrolyte containing 0.5M $H_2SO_4$.

Figure 6:
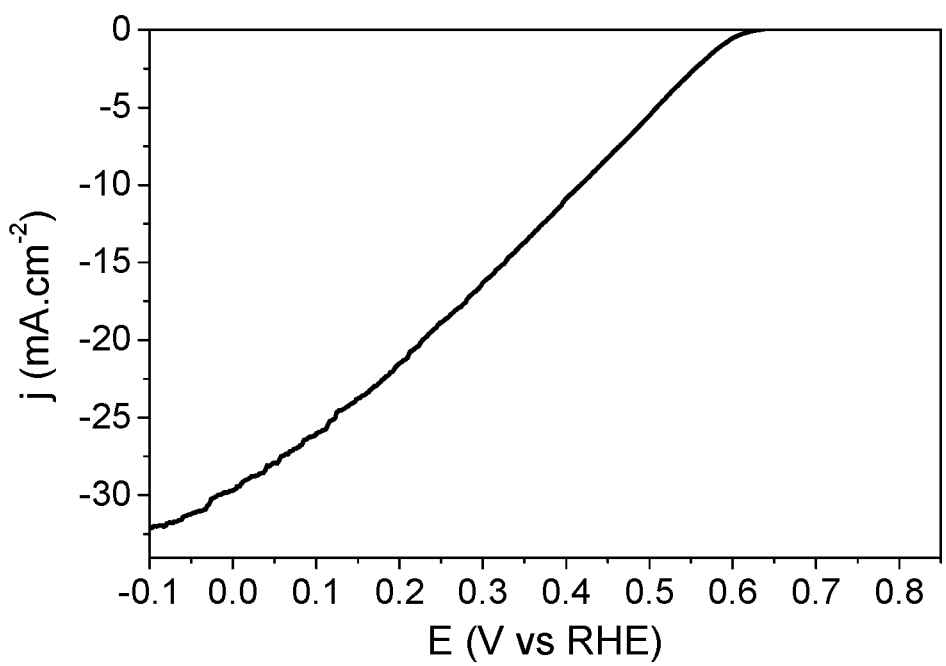
FIG. 6 the change of photoelectrode current density ($j_{cathode}$) as a function of individual photoelectrode potential in a photoelectrode according to example 3.

FIG. 6 shows the cyclic voltammetry of the photocathode where the change of photoelectrode current density ($j_{cathode}$) is shown as a function of individual photoelectrode potential. The scan rate was 20 mV/s.

Example 4a—Photocathode for $H_2$ Evolution

The IBC solar cell comprised a p-type wafer made of silicon and having a thickness of 280 μm.

A titanium (Ti) layer of 25 nm was applied on top of the metal collector of the IBC solar cell. The titanium layer was applied by e-beam process.

A Durimide® layer (resin commercially available from e.g. Fujifilm) with a thickness of 5 microns was deposited to seal the openings and the $p^+$-type doped regions as explained in connection with e.g FIG. 2a).

The Durimide® layer was applied by a spin coating process and after the spin coating process, a photolithography process was performed using a negative revealed mask to discover the areas in correspondence with $n^+$-type doped regions and the emitter busbar such that in use charge carriers from the $n^+$-type regions reach the electrolyte and electrical contact from the emitter busbar is allowed. A small overlap of about 50 microns in the collector busbar area was created to ensure insulation between the emitter and collector contacts.

A protective-conductive layer of nickel epoxy resin (having a thickness of about 500 microns) was deposited at room temperature, and a nickel foam having a thickness of about 1.6 mm coated by electrodeposition with platinum (Pt) was located on top of the resin. The conductive polymer was then cured at 150° C. for 1 h to ensure a good attachment of the metallic foam (i.e. the nickel foam coated with platinum).

The photoelectrode was irradiated using a solar simulator Solar Light 16S equipped with a 300W Xe-lamp and AM 1.5G filter to create a radiation flux of 100 mW $cm^{-2}$.

The illuminated photoelectrode was in contact with an electrolyte containing 0.5M $H_2SO_4$.

Example 4b—Photocathode for $H_2$ Evolution

Example 4b differs from example 4a in that the nickel foam was coated with nickel-molybdenum (Ni—Mo) instead of platinum, which was also coated by electrodeposition.

The photoelectrode was irradiated using a solar simulator Solar Light 16S equipped with a 300W Xe-lamp and AM 1.5G filter to create a radiation flux of 100 mW $cm^{-2}$.

The illuminated photoelectrode with Ni—Mo was in contact with an electrolyte containing 1M KOH.

Figure 7A:
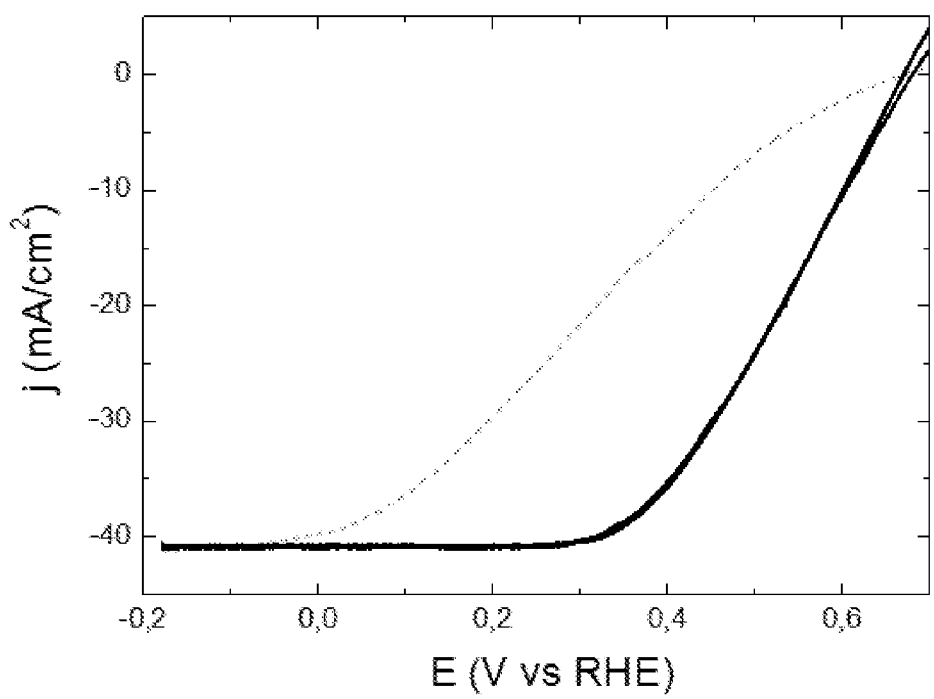
FIG. 7a shows the change of photocathode current density ($j_{cathode}$) as a function of individual photoelectrode potential, according to examples 4a and 4b (solid black line for the photoelectrode with Pt—example 4a, and grey dashed line for the photoelectrode with Ni—Mo—example 4b)

FIG. 7a shows the cyclic voltammetries of the photocathodes of examples 4a and 4b (solid black line for the photoelectrode of example 4a and grey dashed line for the photoelectrode of example 4b) where the change of photoelectrode current density ($j_{cathode}$) is shown as a function of individual photoelectrode potential. The scan rate was 20 mV/s.

Figure 7B:
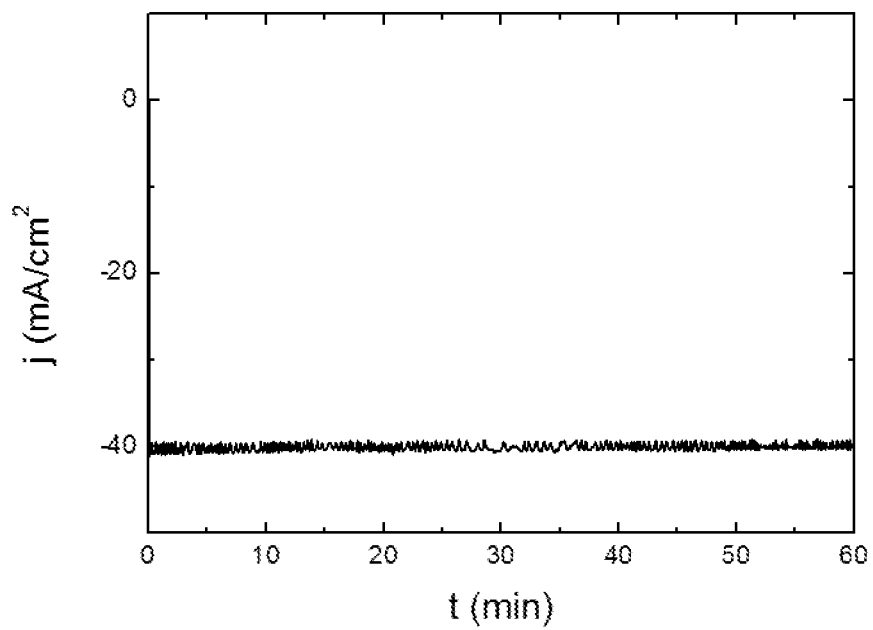
FIG. 7b shows the photocathode current density ($j_{cathode}$) as a function of time when an absolute value of voltage is applied according to example 4a for the photoelectrode with Pt.
Figure 7C:
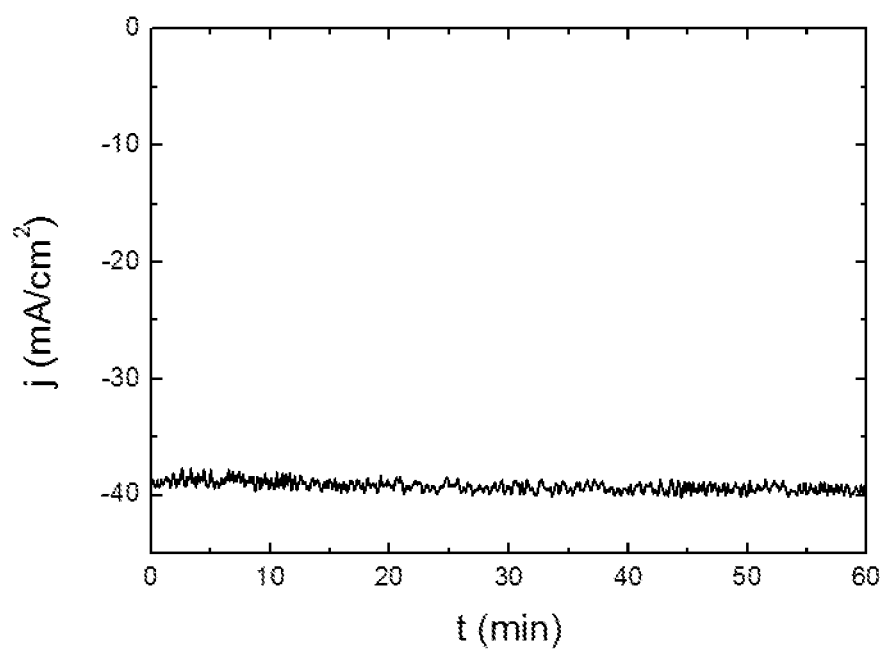
FIG. 7c shows the photocathode current density ($j_{cathode}$) as a function of time when an absolute value of voltage is applied according to example 4b for the photoelectrode with Ni—Mo.

One hour stability tests are shown in FIGS. 7b and 7c. FIGS. 7b and 7c show the cathode current density ($j_{cathode}$) as a function of time for the photoelectrode with Pt (i.e. the photoelectrode of example 4a) and the photoelectrode with Ni—Mo (i.e. of example 4b), respectively. The voltage applied was 0.3 V vs. reversible hydrogen electrode (RHE) for the photoelectrode with Pt and 0 V vs reversible hydrogen electrode (RHE) for the photoelectrode with Ni—Mo.

Although only a number of examples have been disclosed herein, other alternatives, modifications, uses and/or equivalents thereof are possible. Furthermore, all possible combinations of the described examples are also covered. Thus, the scope of the present disclosure should not be limited by particular examples, but should be determined only by a fair reading of the claims that follow.

What is claimed is:

1. A photoelectrode for a photoelectrochemical cell, the photoelectrode extending from a front end surface to an opposing back end surface, wherein the front end surface in use is irradiated with an incident light and the opposing back end surface in use contacts an electrolyte of the photoelectrochemical cell, wherein the photoelectrode comprises
    a back-contact solar cell extending from
        a solar cell front surface that in use constitutes the photoelectrode front end surface to be irradiated with the incident light, to
        an opposing solar cell back surface facing the opposing back end surface,
wherein the opposing solar cell back surface comprises emitter contacts and collector contacts, the emitter contacts and the collector contacts being spaced apart by first openings of the opposing solar cell back surface, the emitter contacts and the collector contacts being respectively collected in an emitter busbar and a collector busbar and
    wherein the photoelectrode further comprises
        a contact passivation layer covering the opposing solar cell back surface to separate the emitter contacts and the collector contacts from the electrolyte when in use, wherein the contact passivation layer further comprises second openings in correspondence with the first openings of the opposing solar cell back surface,
        a resin layer covering the first openings and the second openings and a portion of the contact passivation layer that is in correspondence with the collector contacts such that in use only charge carriers from the emitter contacts traverse the contact passivation layer in its way to the electrolyte while charge carriers from the collector contacts are collected in the collector busbar, and
        an electrocatalyst layer covering respectively the resin layer, the contact passivation layer, or both, wherein the electrocatalyst layer constitutes the opposing back end surface that in use contacts the electrolyte.

2. The photoelectrode of claim 1, wherein the back contact solar cell comprises
    a) a semiconductor substrate having
        i) a substrate front surface defining the solar cell front surface, and
        ii) an opposing substrate back surface facing the opposing solar cell back surface, wherein the semiconductor substrate is selected from n-type and p-type,
    b) one or more $p^+$-type and $n^+$-type doped regions, wherein the $p^+$-type and $n^+$-type doped regions are alternately provided on the opposing substrate back surface, wherein a distribution of the $p^+$-type and $n^+$-type doped regions depends on the semiconductor substrate type, and
    c) a metal collector covering the one or more $p^+$-type and $n^+$-type doped regions to respectively define the emitter contacts and the collector contacts such that in use the metal collector collects the emitter contacts in the emitter busbar and the collector contacts in the collector busbar, wherein the first openings of the opposing solar cell back surface are provided in the metal collector in correspondence with junctions between the one or more $n^+$-type and $p^+$-type doped regions so as to separate the emitter contacts from the collector contacts, wherein the metal collector constitutes the opposing solar cell back surface.

3. The photoelectrode of claim 2, wherein the semiconductor substrate type is p-type, the emitter contacts are defined by the $n^+$-type doped regions and the collector contacts are defined by the $p^+$-type doped regions.

4. The photoelectrode of claim 2, wherein the semiconductor substrate type is n-type, the emitter contacts are defined by the $p^+$-type doped regions and the collector contacts are defined by the $n^+$-type doped regions.

5. The photoelectrode of claim 1, wherein the resin layer is made of a polymer that is chemically stable, has a thermal resistance equal to or higher than 200° C. and has a volume resistivity higher than $10^{16}$ ohm·cm.

6. The photoelectrode of claim 1, wherein the photoelectrode further comprising a second passivation layer arranged between the electrocatalyst layer and respectively the resin layer or the contact passivation layer.

7. A photoelectrochemical cell comprising a first photoelectrode extending from a front end surface to an opposing back end surface, wherein the front end surface in use is irradiated with an incident light and the opposing back end surface in use contacts an electrolyte of the photoelectrochemical cell, wherein the first photoelectrode comprises
    a back-contact solar cell extending from
        a solar cell front surface that in use constitutes the photoelectrode front end surface to be irradiated with the incident light, to
        an opposing solar cell back surface facing the opposing back end surface, wherein the opposing solar cell back surface comprises emitter contacts and collector contacts, the emitter contacts and the collector contacts being spaced apart by first openings of the opposing solar cell back surface, the emitter contacts and the collector contacts being respectively collected in an emitter busbar and a collector busbar and
    wherein the photoelectrode further comprises
        a contact passivation layer covering the opposing solar cell back surface to separate the emitter contacts and the collector contacts from the electrolyte when in use, wherein the contact passivation layer further comprises second openings in correspondence with the first openings of the opposing solar cell back surface,
        a resin layer covering the first openings and the second openings and a portion of the contact passivation layer that is in correspondence with the collector contacts such that in use only charge carriers from the emitter contacts traverse the contact passivation layer in its way to the electrolyte while charge carriers from the collector contacts are collected in the collector busbar, and
        an electrocatalyst layer covering respectively the resin layer, the contact passivation layer, or both, wherein the electrocatalyst layer constitutes the opposing back end surface that in use contacts the electrolyte, and wherein the first photoelectrode is arranged such that in use the incident light irradiates the front end surface and the opposing back end surface contacts the electrolyte.

8. The photoelectrochemical cell of claim 7, wherein the photoelectrochemical cell further comprises:
   a second electrode being arranged spaced apart from the first photoelectrode, and
   an ion-exchange separator located between the first photoelectrode and the second electrode, wherein the first photoelectrode and the second electrode are electrically connected to each other.

9. The photoelectrochemical cell of claim 8, wherein the first photoelectrode comprises a p-type semiconductor substrate, the in which the emitter contacts are defined by the $n^+$-type doped regions and collector contacts are defined by the $p^+$-type doped regions.

10. The photoelectrochemical cell of claim 7, further comprising:
   a) a cathodic compartment which comprises a cathode support frame comprising a cathodic material which acts as a cathode; a first fluid and gaseous $CO_2$ distribution frame and a second fluid and gaseous $CO_2$ distribution frame; one or more cathodic gaskets, the one or more cathodic gaskets being placed between the cathode support frame and the first fluid and gaseous $CO_2$ distribution frames and the second fluid and gaseous $CO_2$ distribution frame, and as lateral ends of the cathodic compartment; wherein the cathode support frame is disposed between the first and second distribution frames;
   b) an anodic compartment which comprises an anode support frame comprising an anodic material which acts as an anode; a fluid distribution frame arranged such that the fluid distribution frame is on a portion of the anodic compartment closer to a membrane than the anode support frame; and one or more anodic gaskets, the one or more anodic gaskets being placed between the anode support frame and the fluid distribution frame, and as lateral ends of the anodic compartment; and
   c) an ion-exchange membrane disposed between the cathodic compartment and the anodic compartment; wherein
      i) the cathodic material is a conductive porous electrode with immobilized $CO_2$ electrocatalyst material;
      ii) the first and second fluid and gaseous $CO_2$ distribution frames, the second fluid and gaseous $CO_2$ distribution frame, and one or more cathodic gaskets are arranged such that in use they the first fluid and gaseous $CO_2$ distribution frame, the second fluid and gaseous $CO_2$ distribution frame and the one or more cathodic gaskets allow introducing a catholyte and gaseous $CO_2$ separately into the cathodic compartment through different inlet ports and the first fluid and gaseous $CO_2$ distribution frame, the second fluid and gaseous $CO_2$ distribution frame and the one or more cathodic gaskets allow exiting the catholyte, liquid and gaseous products and/or unreacted $CO_2$ jointly through an outlet port;
      iii) the fluid distribution frame, the anode support frame and one or more anodic gaskets are arranged in such a way that in use the fluid distribution frame, the anode support frame and the one or more anodic gaskets allow introducing an anolyte into the anodic compartment through an inlet port, and the fluid distribution frame, the anode support frame and the one or more anodic gaskets allow exiting the anolyte and oxidation products jointly through the outlet port;
      iv) the anodic material, is a photocatalytic anodic material, and is located in a side facing the membrane of an optical window of the anode support frame; and is arranged such that in use is able to be in contact with the anolyte which is introduced into the anodic compartment via the inlet port and, is able to be activated when a radiation used to irradiate the anodic compartment reaches the optical window by opposite side of the optical window which is not facing the membrane; and
      v) the photocatalytic anodic material and a gas diffusion cathodic material have a surface area ratio comprised from 1:1 to 1:0.02,
   wherein the anodic material is a n-type semiconductor photoelectrode, the emitter contacts are defined by the $p^+$-type doped regions and collector contacts are defined by the $n^+$-type doped regions.

11. The photoelectrochemical cell of claim 7, further comprising:
   a) a cathodic compartment which comprises a cathode support frame comprising a cathodic material which acts as a cathode; a fluid distribution frame; one or more cathodic gaskets, the one or more cathodic gaskets being placed between the cathode support frame and the fluid distribution frame, and as lateral ends of the cathodic compartment;
   b) an anodic compartment which comprises an anode support frame comprising an anodic material which acts as an anode; a fluid distribution frame arranged such that the fluid distribution frame is on a portion of the anodic compartment closer to a membrane than the anode support frame; and one or more anodic gaskets, the one or more anodic gaskets being placed between the anode support frame and the fluid distribution frame, and as lateral ends of the anodic compartment; and
   c) an ion-exchange separator disposed between the cathodic compartment and the anodic compartment; wherein
      i) the cathodic material is an electrode with immobilized hydrogen evolution reaction (HER) electrocatalyst material;
      ii) the fluid distribution frame and the one or more cathodic gaskets are arranged such that in use the fluid distribution frame and the one or more cathodic gaskets allow introducing a catholyte into the cathodic compartment through an inlet port and the fluid distribution frame and the one or more cathodic gaskets allow exiting the catholyte and the reduction product jointly through an outlet port;
      iii) the fluid distribution frame, the anode support frame and the one or more anodic gaskets are arranged in such a way that in use the fluid distribution frame and the one or more anodic gaskets allow introducing an anolyte into the anodic compartment through the inlet port, and the fluid distribution frame and the one or more anodic gaskets allow exiting the anolyte and oxidation products jointly through the outlet port;
      iv) the anodic material, is an electrode containing an oxygen evolution reaction (OER) electrocatalyst material, and
      v) the anodic material and the cathodic material have a surface area ratio comprised from 1:1 to 1:0.02, wherein cathodic material is a p-type semiconductor photoelectrode, the emitter contacts are defined by the $n^+$-type doped regions and the collector contacts are defined by the $p^+$-type doped regions or the anodic material is a n-type semiconductor photoelectrode, the emitter contacts are defined by the $p^+$-type doped regions and the collector contacts are defined by the $n^+$-type doped regions, the photoelectrode being located in a side facing the membrane of an optical window and, is able to be activated when a radiation used to irradiate reaches the optical window by opposite side of the optical window which is not facing the membrane.

12. A method of manufacturing the photoelectrode of claim 1 comprising:
providing the back-contact solar cell,
providing the contact passivation layer covering the opposing solar cell back surface, the contact passivation layer being provided with the second openings in correspondence with the first openings,
providing the resin layer to seal the first openings and the second openings, wherein the resin layer further covers the portion of the contact passivation layer that is in correspondence with the collector contacts, and
providing the electrocatalyst layer covering respectively the resin layer and the contact passivation layer.

13. The method of claim 12, wherein the method further comprising providing a passivation layer between the electrocatalyst layer and respectively the contact passivation layer, the resin layer or both; wherein the passivation layer is provided by atomic layer deposition, by pulsed laser deposition, by sol-gel processes, by blade coating, or by screen-printing.

14. The method of claim 12, wherein the resin layer is provided by spin coating and photolithography is used so as to open areas not to be covered by the resin layer.

15. The method of any of claim 12, wherein the contact passivation layer is provided by evaporation processes.

16. The method of any of claim 12, wherein the electrocatalyst layer is provided by evaporation processes or by deposition of thin films.

17. The method of claim 16, wherein the deposition of thin films comprises deposition over a substrate selected from the group consisting of foam or mesh.

18. The method of claim 13, wherein the resin layer is provided by spin coating and photolithography is used so as to open areas not to be covered by the resin layer.

19. The photoelectrode of claim 3, wherein the resin layer is made of a polymer that is chemically stable, has a thermal resistance equal to or higher than 200° C. and has a volume resistivity higher than $10^{16}$ ohm·cm.

20. The photoelectrode of claim 4, wherein the resin layer is made of a polymer that is chemically stable, has a thermal resistance equal to or higher than 200° C. and has a volume resistivity higher than $10^{16}$ ohm·cm.

21. The photoelectrochemical cell according to claim 8, wherein the first photoelectrode comprises a n-type semiconductor substrate, in which the emitter contacts are defined by the $p^+$-type doped regions and the collector contacts are defined by the $n^+$-type doped regions.

22. The photoelectrochemical cell according to claim 8, wherein the first photoelectrode comprises a p-type semiconductor substrate, in which the emitter contacts are defined by the $n^+$-type doped regions and the collector contacts are defined by the $p^+$-type doped regions; and the second electrode is a photoelectrode that comprises a n-type semiconductor substrate, in which the emitter contacts are defined by the $p^+$-type doped regions and the collector contacts are defined by the $n^+$-type doped regions.

* * * * *